United States Patent [19]

Marr et al.

[11] 4,038,107

[45] July 26, 1977

[54] METHOD FOR MAKING TRANSISTOR STRUCTURES

[75] Inventors: George Marr, Cupertino, Calif.; George Elwood Smith, Murray Hill, N.J.

[73] Assignees: Burroughs Corporation, Detroit, Mich.; Bell Telephone Laboratories Incorporated, Murray Hill, N.J.

[21] Appl. No.: 637,177

[22] Filed: Dec. 3, 1975

[51] Int. Cl.² .............................................. H01L 21/26
[52] U.S. Cl. ....................................... 148/1.5; 148/187
[58] Field of Search ................................ 148/1.5, 187

[56] References Cited

U.S. PATENT DOCUMENTS

| | | | |
|---|---|---|---|
| 3,372,067 | 3/1968 | Schafer | 148/187 |
| 3,406,049 | 10/1968 | Marinace | 148/187 UX |
| 3,456,168 | 7/1969 | Tatom | 317/235 |
| 3,558,366 | 1/1971 | Lepselter | 148/1.5 |
| 3,719,535 | 3/1973 | Zoroglu | 148/187 |
| 3,765,961 | 10/1973 | Mar | 148/175 |
| 3,947,299 | 3/1976 | Weijland et al. | 48/187 |

OTHER PUBLICATIONS

Rogers et al., "An Experimental and Theoretrical Analysis—etc." IEE J. & Sol. State Circ., vol. SC-10, No. 5 pp. 322-331, 10/75.

*Primary Examiner*—G. Ozaki
*Attorney, Agent, or Firm*—Irwin Ostroff

[57] ABSTRACT

An extremely short channel Field Effect Transistor (FET) is made by making a first ion implant through a polysilicon mask aperture, converting the surface of the polysilicon into $SiO_2$ to constrict the aperture size and then making a second ion implant of the opposite type impurity through the constricted aperture. The $SiO_2$ growth effectively moves the edge of the mask by a small controlled distance. This permits a small controlled spacing between the two ion implants, which is used for defining an extremely short FET channel. Alternatively, a bipolar transistor with a narrow base zone can be made by analogous processing.

6 Claims, 5 Drawing Figures

4,038,107

METHOD FOR MAKING TRANSISTOR STRUCTURES

BACKGROUND OF THE INVENTION

This invention relates to methods for making transistor structures, and more particularly, to methods for making transistors having impurity regions separated by extremely small lateral distances.

Because of its ease of fabrication, the field effect transistor (FET) is finding widespread use in integrated circuit technology. The most common FET is one using source and drain regions on the surface of a silicon wafer separated by a channel region through which current is controlled by a gate electrode overlying the channel region and insulated from it by a thin layer of silicon dioxide. These devices lend themselves to large scale integrated circuit fabrication techniques because all of the source and drain regions can be made by simultaneous impurity diffusions or ion-implantations, and relatively large packing densities can be achieved. One drawback is that their electronic speed of operation is limited by the difficulty of making a short channel over which a gate electrode can be accurately registered.

A device that is structurally related to the FET is the lateral bipolar transistor in which emitter and collector regions on the surface of a wafer are separated by a short base region. The applicability of these devices is limited by the difficulty in making a sufficiently short base region on the surface of the wafer.

SUMMARY OF THE INVENTION

An extremely short channel FET is made by making a first ion implant through a polysilicon mask aperture, converting the surface of the polysilicon into SiO$_2$ to constrict the aperture size and then making a second ion implant of the opposite type impurity through the constricted aperture. The SiO$_2$ growth effectively moves the edge of the mask by a small controlled distance. This permits a small controlled spacing between the two ion implants which is used for defining an extremely short FET channel. Alternatively a bipolar transistor with a narrow base zone can be made by analogous processing.

For example, the first ion implant may be of p-material which penetrates through a thin n-type layer on a substrate surface. The second ion implant may be of n-type material which is separated by an extremely short distance from the original n-layer by the p-region. This extremely short p-type separation between regions of n-type conductivity may constitute either a very short channel of a FET or a short base region of a bipolar transistor.

Other objects, features and advantages of the invention will be better understood from a consideration of the following detailed description taken in conjunction with the accompanying drawing.

DETAILED DESCRIPTION

Figure 1:
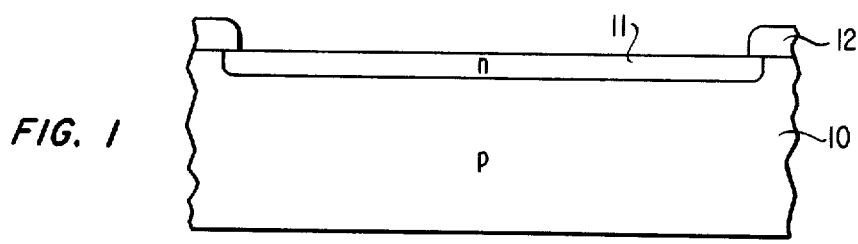
FIGS. 1–3 are schematic sectional views of a semiconductor wafer illustrating various steps in the fabrication of a transistor in accordance with an illustrative embodiment of the invention.
Figure 2:
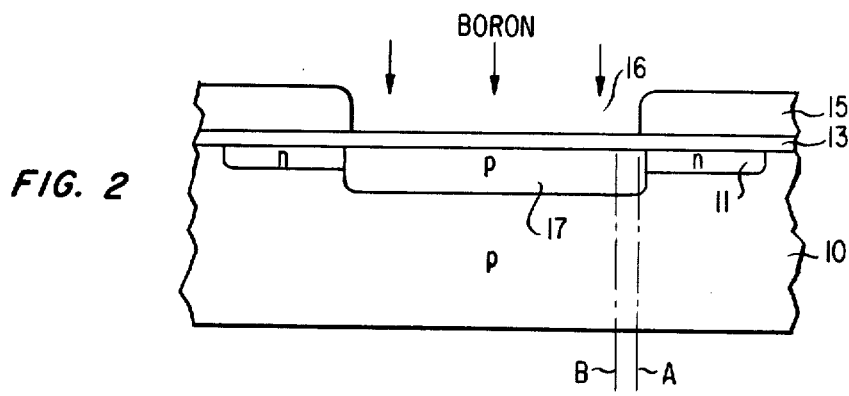
Figure 3:
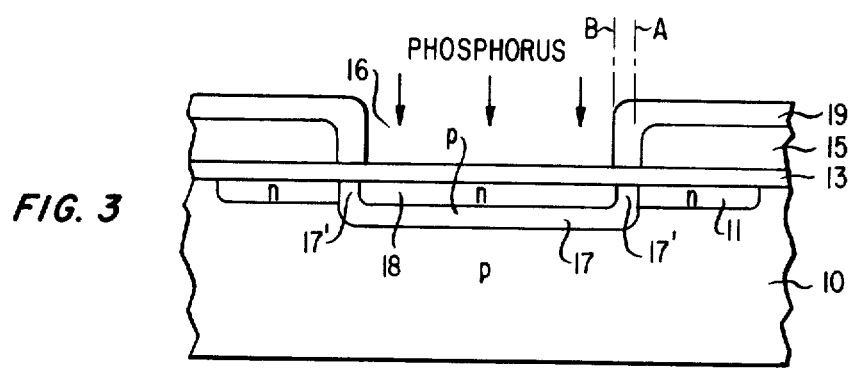

FIGS. 1–3 illustrate a process for making an FET having a relatively short channel length in accordance with an illustrative embodiment of the invention. Referring now to FIG. 1, a thin layer of n-type conductivity 11 is selectively formed in a p-type silicon semiconductor substrate 10, as by diffusion, using a layer 12 of silicon dioxide with an aperture therein as a mask in a manner well known in the art. Referring now to FIG. 2 the oxide layer 12 is then removed and a thin oxide layer 13, (to be used as the gate oxide layer) is thermally grown on the wafer 10.

Next, a relatively thick layer 15 of polysilicon is deposited over all but a central portion of the transistor location. This can be achieved either by a uniform deposit and a subsequent removal of a central portion or by limiting the initial deposition to exclude a central portion. Either of these techniques are well known in the art. The purpose of the polysilicon layer 15 is to constitute an ion implant mask having a central aperture 16; as such, layer 15 is of sufficient thickness to preclude penetration of the implanted ions as is known in the art.

Next, p-type impurities, such as boron ions, are implanted through the aperture 16 and through the gate oxide to form a p-layer 17 in the substrate adjacent to layer 11. Ion implantation is a process well understood in the art. The boron ions are projected by appropriate apparatus toward the wafer as shown by the arrows, and penetrate the gate oxide layer 13, and form the layer 17 which is of highly controllable thickness and has a controllable carrier concentration profile. The layer 17 is formed so as to be thicker than layer 11 and is sufficiently doped with p-type impurities to convert the portion of layer 11 encompassed to a p-type region.

Referring to FIG. 3, the polysilicon layer 15 is next at least partially oxidized to form thereover a silicon dioxide layer 19. In the process of oxidizing the exposed surface of the polysilicon layer, the aperture 16 is effectively constricted. This is because for every 0.45 micron of silicon oxidized, a one micron layer of SiO$_2$ is formed. Thus, the sum of the thicknesses of layers 15 and 19 of FIG. 3 is slightly greater than the total thickness of layer 15 of FIG. 2, and consequently aperture 16 is constricted. Accordingly by controlling the extent of oxidation there is accurately controlled the change in size of the mask opening.

Next, an n-type layer 18 is formed in p-type layer 17 by ion implantation of an appropriate impurity such as phosphorous. Because the edge of oxide layer 19 is removed from the edge of the polysilicon layer 15, the edge of the n-type layer 18 is removed from n-region 11 and is separated from region 1 by a small portion of p-region 17 which is illustrated as 17'. This narrow p-type separation 17' eventually constitutes an extremely short channel of a FET to separate source and drain regions. Thus, n-type regions 18 and 11 may constitute the drain and source of an MOS-type FET which has an extremely short p-type channel region 17'. Alternatively, region 18, 17' and 11 may respectively constitute the emitter, base and collector of an n-p-n-type lateral bipolar transistor. In the bipolar transistor alternative, one would ordinarily omit the initial step of forming the gate oxide layer 13.

It normally is important after the ion implantation to anneal the wafer to repair the damage to the crystal lattice and to move the implanted ions from interstitial positions to substitutional positions to increase their electrical activity. Also it is feasible when desired to provide some diffusion of the implanted ions deeper into the wafer if desired by appropriate heating.

Figure 4A:
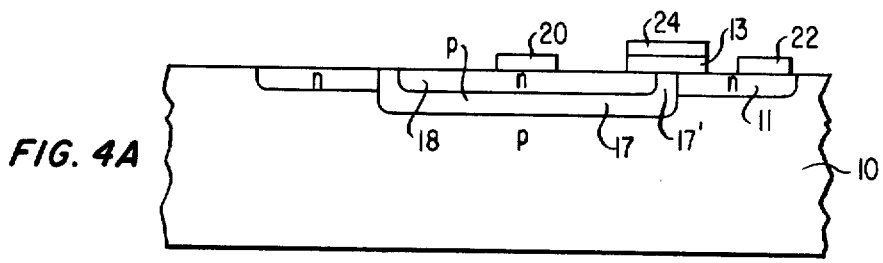
FIG. 4A illustrate an FET transistor structure in accordance with an illustrative embodiment of the invention.

Referring now the FIG. 4A there is illustrated the basic structure of FIG. 3 with electrical contacts 20 and 22 made to n-type regions 11 and 18 respectively, and electrical contact 24 made above the oxide layer 13 over p-type region 17'. Contacts 20 and 22 serve as the drain and source contacts and the contact 24 serves as the gate contact. As such the structure of FIG. 4A is a FET commonly denoted as an n-channel MOS transistor.

Figure 4B:
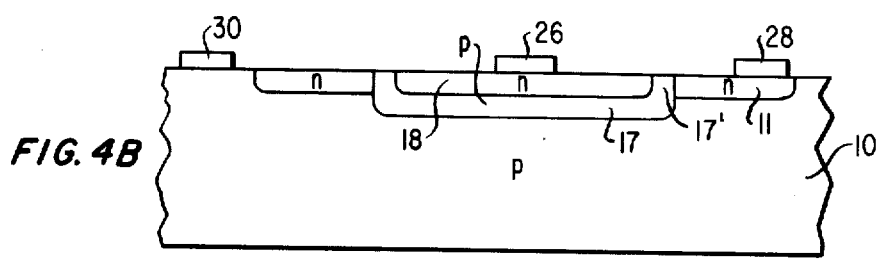
FIG. 4B illustrates a lateral bipolar transistor structure in accordance with an illustrative embodiment of the invention.

Referring now to FIG. 4B there is illustrated the basic structure of FIG. 3 (without oxide layer 13) with electrical contacts 26 and 28 made to the n-type regions 18 and 11 respectively. Contacts 26 and 28 serve as the emitter and collector contacts of an n-p-n-type lateral bipolar junction transistor. The p-type substrate 17 (which is electrically connected to 17') can be contacted from below (not illustrated) or a surface portion of region 10, which is electrically connected to region 17, can be contacted as illustrated by contact 30. This contact to region 10 serves as the base contact of the lateral bipolar junction transistor.

From the foregoing, it can be appreciated that fabrication of the device is amenable to integrated circuit techniques and that numerous extremely high-speed transistors can be simultaneously formed. For example, oxidizing the polysilicon to form an SiO₂ layer 19 two microns thick necessarily moves the edge of aperture 16 from location A to location B, a distance of approximately 1.1 microns (this can be appreciated by recalling that each micron growth of oxide consumes 0.45 microns of polysilicon). Since the controlled thermal oxidation of silicon is the subject of a well developed and well known technique in the integrated circuit industry, it can be performed simultaneously with greater precision on numerous transistor locations located on a number of wafers as is well understood in the art.

It can be appreciated that although polycrystalline silicon normally will be preferred for use as the mask, it will be feasible to employ other materials having the requisite properties particularly the ability to be oxidized or otherwise chemically treated to permit controlled surface growth whereby apertures therein can be controllably constricted.

The foregoing is to be considered merely illustrative of the inventive concepts. Materials other than silicon as the semiconductor can be used as could other conductivities and implant processes. While ion implantation has been used for the localized introduction of impurities into the semiconductor for defining the channel or base regions, it should be apparent that other techniques such as diffusion may be employed. However when diffusion is used, it should be recognized that the use of polycrystalline silicon as the mask poses problems since such mask will tend to be oxidized during the diffusion. In such instances, it may be particularly advantageous to employ for use as the mask a material which is more stable at normal diffusion temperatures. Various other embodiments and modifications may be made by those skilled in the art without departing from the spirit and scope of the invention.

What is claimed is:

1. In a method for making at least one semiconductor device having a first impurity region removed a short lateral distance from a second impurity region, the improvement CHARACTERIZED BY forming over the semiconductor substrate a mask having an opening having a first vertical edge; controllably decreasing the opening in the mask thereby to define a second vertical edge laterally removed a controlled distance from the location of the first edge; using the first edge to define the location of the first impurity region in the substrate; and using the second edge to define the location of the second impurity region.

2. The method of claim 1 wherein:
the step of decreasing the opening in the mask comprises the step of oxidizing the exposed surface of the mask.

3. The method of claim 2 wherein:
the step of using the first edge to define the location of the first impurity region comprises the step of ion implanting a first impurity through the opening in the mask; and the step of using the second edge to define the location of the second impurity region comprises the step of ion implanting a second impurity through the opening in the mask after the mask has been oxidized.

4. Method of claim 3 wherein the mask is silicon and the step of controllably decreasing the opening in the mask comprises the step of exposing the mask to an oxygenated atmosphere and heating so as to convert part of the silicon mask to silicon dioxide by thermal oxidation.

5. A method for making at least one semiconductor device having two impurity regions which are spaced from one another by a short lateral distance comprising the steps of:
forming in a semiconductor substrate of a first conductivity type a first region of the opposite conductivity type;
forming over the substrate a mask having an opening therethrough which has a first vertical edge which overlies a portion of the first region;
using the first vertical edge of the mask to define the location of a second region in the substrate which is of the same conductivity type as the substrate and extends through the first region to the substrate;
controllably decreasing the opening in the mask to define a second vertical edge laterally removed a controlled distance from the location of the first vertical edge; and
using the second edge of the mask to define the location of a third region in the substrate which is wholly confined within the second region and is of the same conductivity type as the first region.

6. The method of claim 5 wherein:
the mask is silicon and the step of controllably decreasing the opening in the mask comprises the step of exposing the mask to an oxygenated atmosphere and heating so as to convert part of the silicon mask to silicon dioxide by thermal oxidation;
the step of using the first edge to define the location of the first impurity region comprises the step of ion implanting a first impurity region through the opening in the mask; and
the step of using the second edge to define the location of the second impurity region comprises the step of ion implanting a second impurity region through the opening in the mask after the mask has been oxidized.

* * * * *

REEXAMINATION CERTIFICATE (2538th)
United States Patent [19]
Marr et al.

[11] B1 4,038,107
[45] Certificate Issued Apr. 18, 1995

[54] METHOD FOR MAKING TRANSISTOR STRUCTURES

[75] Inventors: George Marr, Cupertino, Calif.; George E. Smith, Murray Hill, N.J.

[73] Assignee: Samsung Semiconductor and Telecommunications, Ltd., Kyung-Sangbukdo, Rep. of Korea

Reexamination Request:
No. 90/002,464, Oct. 1, 1991

Reexamination Certificate for:
Patent No.: 4,038,107
Issued: Jul. 26, 1977
Appl. No.: 637,177
Filed: Dec. 3, 1975

[51] Int. Cl.$^6$ ............................ H01L 21/265
[52] U.S. Cl. .................... 437/27; 437/933; 437/968; 148/DIG. 111
[58] Field of Search .......... 437/27, 44, 31, 933, 437/948, 968; 148/DIG. 102, DIG. 103, DIG. 104, DIG. 111

[56] References Cited
U.S. PATENT DOCUMENTS

3,660,171 5/1972 Tsuchimoto .................... 437/933
4,037,308 7/1977 Smith .......................... 29/571
4,037,309 7/1977 Smith .......................... 29/571

FOREIGN PATENT DOCUMENTS

2024822 5/1970 Germany.
1339384 12/1973 United Kingdom.

OTHER PUBLICATIONS

Powell et al "Selective Oxidation of Silicon in Low—Temperature High Pressure Steam" *IEEE Trans. on Electron Dev.* vol. ED21, No. 10, Oct. 1974, pp. 636–640.

"Self-Aligned Insulated Gate Field-Effect Transistor", *IBM Technical Disclosure Bulletin*, vol. 16, No. 5, Oct., 1973, p. 1498.

*Primary Examiner*—Brian E. Hearn

[57] ABSTRACT

An extremely short channel Field Effect Transistor (FET) is made by making a first ion implant through a polysilicon mask aperture, converting the surface of the polysilicon into $SiO_2$ to constrict the aperture size and then making a second ion implant of the opposite type impurity through the constricted aperture. The $SiO_2$ growth effectively moves the edge of the mask by a small controlled distance. This permits a small controlled spacing between the two ion implants, which is used for defining an extremely short FET channel. Alternatively, a bipolar transistor with a narrow base zone can be made by analogous processing.

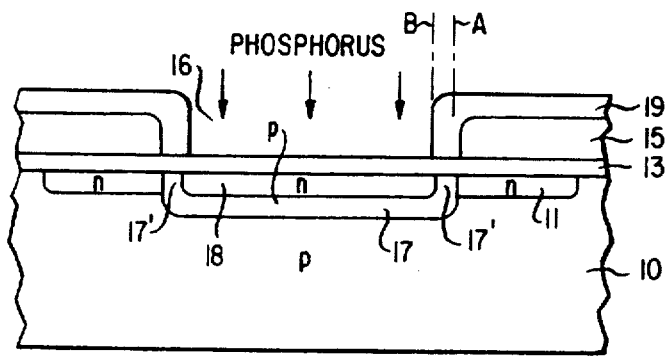

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 2–6 is confirmed.

Claim 1 is cancelled.

* * * * *